United States Patent
Yoshida

(10) Patent No.: US 11,879,930 B2
(45) Date of Patent: Jan. 23, 2024

(54) TEST CIRCUIT AND TESTING METHOD

(71) Applicant: FUJI ELECTRIC CO., LTD., Kawasaki (JP)

(72) Inventor: Mitsuru Yoshida, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/950,764

(22) Filed: Sep. 22, 2022

(65) Prior Publication Data

US 2023/0128311 A1 Apr. 27, 2023

(30) Foreign Application Priority Data

Oct. 22, 2021 (JP) .................................. 2021-172921

(51) Int. Cl.
*G01R 31/26* (2020.01)
*H03K 17/0812* (2006.01)

(52) U.S. Cl.
CPC ... *G01R 31/2621* (2013.01); *H03K 17/08128* (2013.01)

(58) Field of Classification Search
CPC ......... H03K 17/08128; H03K 17/0828; G01R 31/2621; Y02P 40/57; C03B 11/12
See application file for complete search history.

(56) References Cited

U.S. PATENT DOCUMENTS

| | | | |
|---|---|---|---|
| 2012/0153974 A1* | 6/2012 | Hashimoto | G01R 31/2621 324/750.01 |
| 2012/0182031 A1 | 7/2012 | Tokumoto et al. | |
| 2013/0328610 A1 | 12/2013 | Hayashi | |
| 2014/0203860 A1* | 7/2014 | Senda | H03K 17/0828 327/381 |
| 2016/0268894 A1 | 9/2016 | Hayashi | |

FOREIGN PATENT DOCUMENTS

| | | |
|---|---|---|
| JP | 2012-032327 A | 2/2012 |
| JP | 2013-092534 A | 5/2013 |
| JP | 2013-251671 A | 12/2013 |
| JP | 2016-167693 A | 9/2016 |

* cited by examiner

*Primary Examiner* — Alvaro E Fortich
*Assistant Examiner* — Adam S Clarke
(74) *Attorney, Agent, or Firm* — Rabin & Berdo. P.C.

(57) ABSTRACT

A test circuit for testing a switching device. The test circuit includes: a first terminal for receiving a drive signal; second, third and fourth terminals respectively coupled to a ground electrode, a control electrode and a power-supply electrode, of the switching device; and a clamping circuit coupled between the second terminal and the fourth terminal. The clamping circuit is configured to, upon turning on of the switching device responsive to the drive signal, cause a voltage at the third terminal to be a first voltage higher than a threshold of the switching device, and, upon turning off of the switching device responsive to the drive signal, cause the voltage at the third terminal to be a third voltage between the threshold and the first voltage, while clamping a voltage at the fourth terminal to a second voltage lower than a withstand voltage of the switching device.

8 Claims, 15 Drawing Sheets

TEST CIRCUIT AND TESTING METHOD

CROSS-REFERENCE TO RELATED APPLICATION

The present application claims priority pursuant to 35 U.S.C. § 119 from Japanese patent application number 2021-172921 filed on Oct. 22, 2021, the entire disclosure of which is hereby incorporated by reference herein.

BACKGROUND

Technical Field

The present disclosure relates to a test circuit and a testing method.

Description of the Related Art

Switching devices such as power metal-oxide-semiconductor field-effect transistors (MOSFETs), insulated gate bipolar transistors (IGBTs), and the like are subjected to a screening test (such as an avalanche test, a switching test, a static withstand voltage test, etc.) to be screened for an initial failure and a defective product.

There are two types of switching device products: an avalanche-proof product and a non-avalanche-proof product. To conduct a screening test on a non-avalanche-proof product, it is desirable to protect the device. Examples of a circuit for such protection include a current interruption switch (see, for example, Japanese Patent Application Publication No. 2013-92534) and a clamping circuit (see, for example, Japanese Patent Application Publication Nos. 2013-251671, 2016-167693, and 2012-32327).

However, even if a current is interrupted as in Japanese Patent Application Publication No. 2013-92534, it may take time for such interruption, which makes it impossible to completely eliminate damage to the switching device. Also, the clamping circuits in Japanese Patent Application Publication Nos. 2013-251671, 2016-167693, and 2012-32327 cannot effectively screen non-avalanche-proof products, and thus may be unable to perform accurate evaluation.

SUMMARY

An aspect of an embodiment of the present disclosure is a test circuit for conducting a test on a switching device, the switching device having a ground electrode, a control electrode, and a power-supply electrode, the test circuit comprising: a first terminal configured to receive a drive signal to turn on and off the switching device; a second terminal coupled to the ground electrode of the switching device; a third terminal coupled to the control electrode of the switching device; a fourth terminal coupled to the power-supply electrode of the switching device; and a clamping circuit coupled between the second terminal and the fourth terminal, the clamping circuit being configured to, upon turning on of the switching device responsive to the drive signal, cause a voltage at the third terminal to be a first voltage higher than a threshold of the switching device, and the clamping circuit being configured to, upon turning off of the switching device responsive to the drive signal, and while clamping a voltage at the fourth terminal to a second voltage lower than a withstand voltage of the switching device, cause the voltage at the third terminal to be a third voltage that is between the threshold of the switching device and the first voltage.

DETAILED DESCRIPTION

At least following matters will become apparent from the descriptions of the present specification and the accompanying drawings.

Screening Test and Comparative Example

A large number of power semiconductor devices (hereinafter, referred to as switching devices) such as power metal-oxide-semiconductor field-effect transistors (MOSFETs) and/or insulated gate bipolar transistors (IGBTs) are formed in a wafer substrate. These switching devices are separated by dicing and then incorporated into semiconductor modules.

A screening test is a test to evaluate whether switching devices operate normally in order to sift out (screen out) ones with initial failure and/or defective products, and is usually conducted in a state of a chip before the switching devices are incorporated into semiconductor modules. The screening test includes dynamic performance tests such as a switching test and an L-load avalanche test (hereinafter also referred to simply as avalanche test) and static performance tests such as an interelectrode leakage current test and a static withstand voltage test. The following mainly describes a dynamic performance test.

Figure 1:
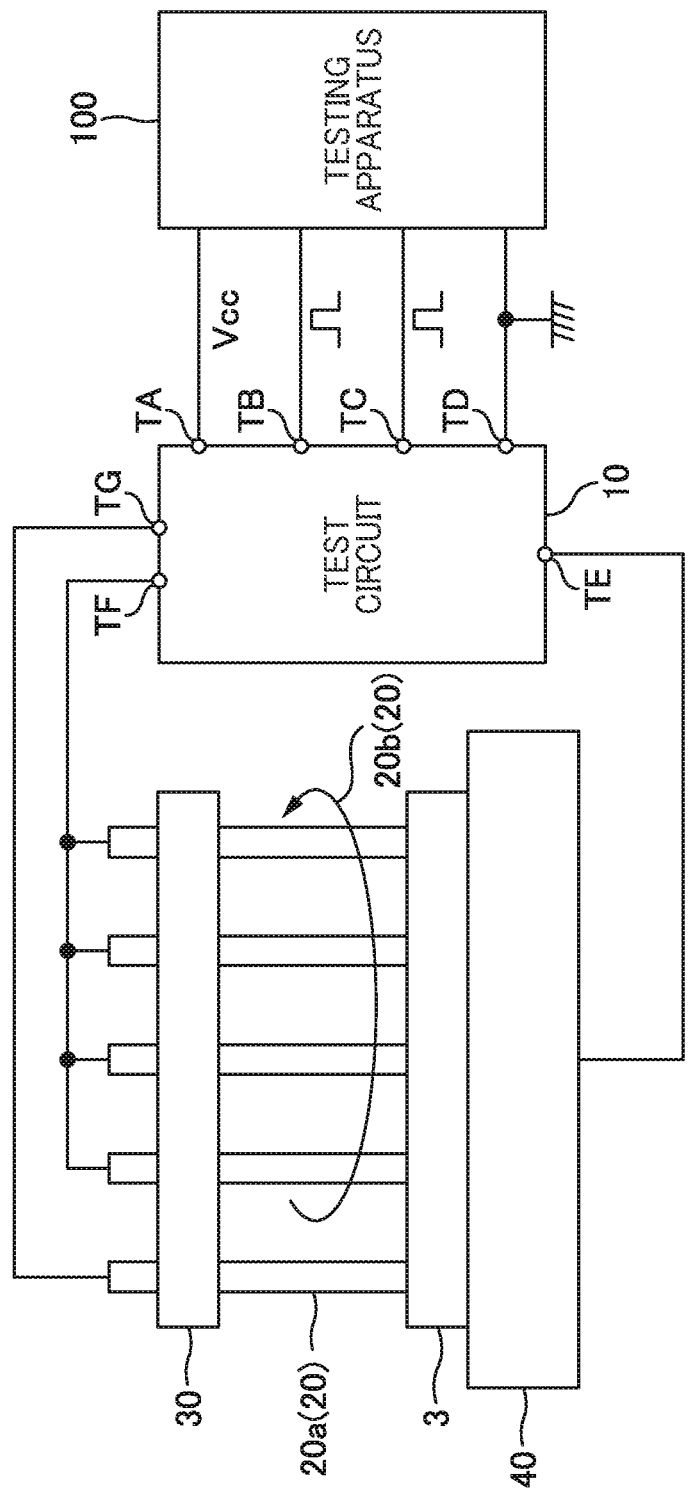
FIG. 1 is a diagram illustrating the configuration of a system including a test circuit 10 of a comparative example.
Figure 2A:
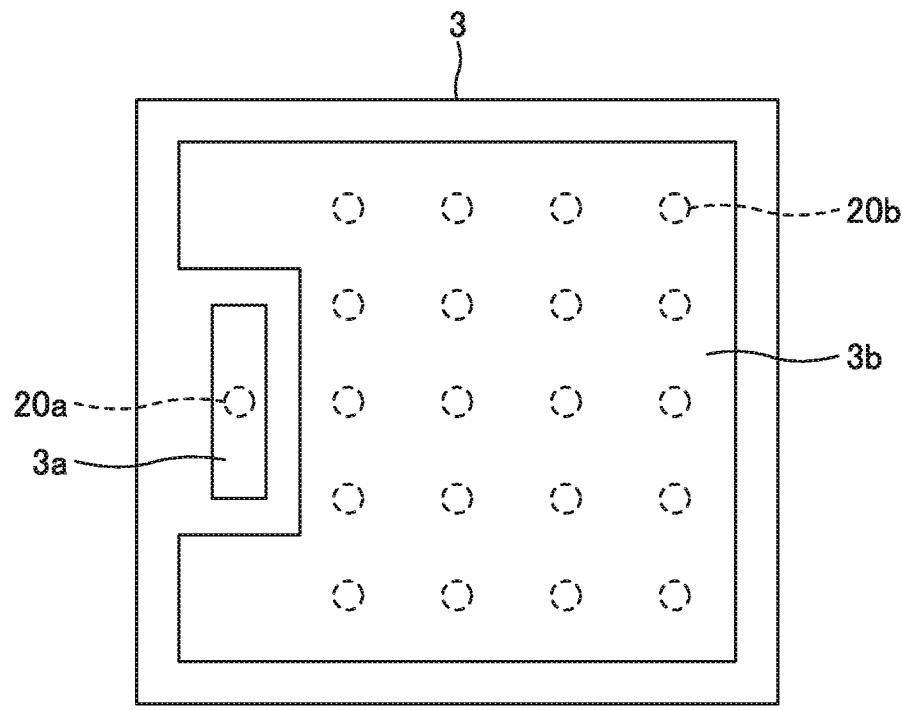
FIG. 2A is a top view illustrating a positional relationship between a switching device 3 and probes 20 (probes 20a, 20b).
Figure 2B:
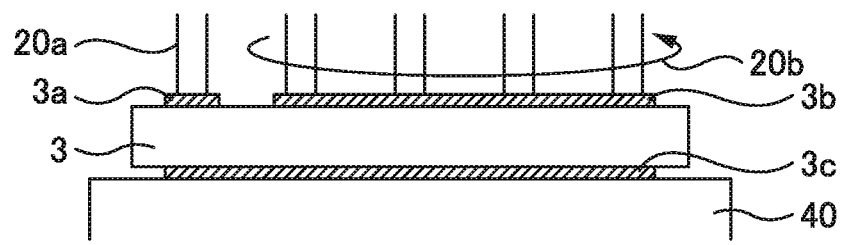
FIG. 2B is a side view illustrating a state in which a switching device 3 is in contact with probes 20 and a stage 40.

FIG. 1 is a diagram illustrating the configuration of a system including a test circuit 10 of a comparative example. FIG. 2A is a top view illustrating the positional relationship between a switching device 3 and probes 20 (probes 20a, 20b), and FIG. 2B is a side view illustrating a state in which the switching device 3 is in contact with the probes 20 and a stage 40. FIG. 2A illustrates the positions of the plurality of probes 20 by broken lines.

The system illustrated in FIG. 1 includes the plurality of probes 20, a contact block 30 supporting the plurality of probes 20, the stage 40 supporting the switching device 3, which is an object to be tested, the test circuit 10, and a testing apparatus 100. Herein, a description will be given of a case where the switching device 3 is an IGBT, however, the present disclosure is not limited to this, and the switching device 3 may be, for example, a MOSFET. Also, the stage 40 and the probes 20 are made of conductive metal and/or the like and each thereof is coupled to the test circuit 10 through wiring. The test circuit 10 is coupled to the testing apparatus 100.

The testing apparatus 100 conducts a test (screening test) on the switching device 3 through the test circuit 10. The testing apparatus 100 includes a power supply that supplies a power supply voltage Vcc, a drive circuit that outputs a drive signal (pulse signal) to turn on and off the switching device 3 or a current interrupting device 2 (to be described later), a microcomputer that controls the operation of components, and the like (none of these is illustrated). The testing apparatus 100 also includes, for example, a detection circuit (not illustrated) that detects an abnormality such as overcurrent by monitoring current values and voltage values during the test.

The test circuit 10 is supplied with the power supply voltage Vcc, a drive signal (pulse signal), and a ground voltage (GND potential) from the testing apparatus 100, to conduct a test on the switching device 3. As illustrated in FIG. 1, the test circuit 10 includes terminals TA to TG.

The terminals TA to TD are coupled to the testing apparatus 100. The terminal TE is coupled to the stage 40 through wiring and/or the like. The terminal TG is coupled to one (probe 20a) of the plurality of probes 20, and the terminal TF is coupled to another one of the probes 20. Details of the test circuit 10 will be described later.

As illustrated in FIGS. 2A and 2B, a gate electrode 3a and an emitter electrode 3b are formed in the front surface of the switching device 3 (the surface facing the probes 20). Also, as illustrated in FIG. 2B, a collector electrode 3c made of a metal film is formed in the back surface of the switching device 3 (the surface contacting the stage 40).

With the switching device 3 being disposed on the stage 40, the collector electrode 3c of the switching device 3 comes into contact with the stage 40. In other words, the collector electrode 3c of the switching device 3 is electrically coupled to the terminal TE of the test circuit 10 through the stage 40 (and wiring).

Also, with the switching device 3 being disposed on the stage 40, the contact block 30 and the stage 40 are moved relative to each other to bring the plurality of probes 20 into contact with the electrodes (gate electrode 3a, emitter electrode 3b) in the front surface of the switching device 3.

Note that, as illustrated in FIG. 2A, the area of the emitter electrode 3b in the front surface of the switching device 3 is larger than that of the gate electrode 3a and, for example, one (probe 20a) of the plurality of probes 20 comes into contact with the gate electrode 3a, and the rest of the probes 20 (probes 20b) comes into contact with the emitter electrode 3b. Note that the number of probes 20 to contact the gate electrode 3a is not limited to this, and two or more probes may contact the gate electrode 3a.

With the probe 20a contacting the gate electrode 3a of the switching device 3, the gate electrode 3a is electrically coupled to the terminal TG of the test circuit 10 through the probe 20a (and wiring).

Also, with the plurality of probes 20b contacting the emitter electrode 3b of the switching device 3, the emitter electrode 3b is electrically coupled to the terminal TF of the test circuit 10 through the plurality of probes 20b (and wiring).

Then, the switching device 3 is energized by the testing apparatus 100 through the test circuit 10, the probes 20 (probes 20a, 20b), and the stage 40, to be evaluated for electric characteristics.

<Configuration of Test Circuit 10>

Figure 3:
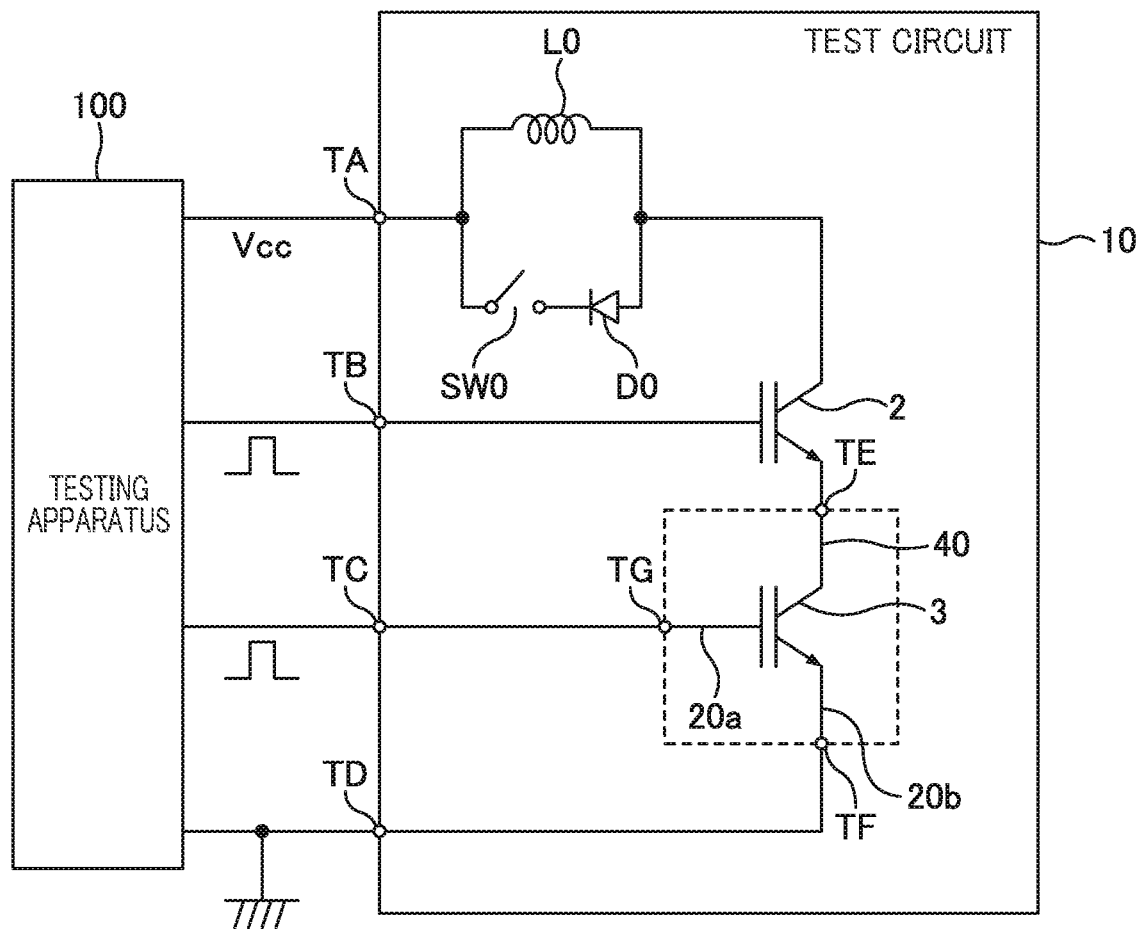
FIG. 3 is a circuit diagram illustrating a test circuit 10 of a comparative example.

FIG. 3 is a circuit diagram illustrating the test circuit 10 of a comparative example.

As illustrated in FIG. 3, the test circuit 10 includes the terminals TA to TG, a coil L0, a regenerative diode D0, a switch SW0, and the current interrupting device 2. In FIG. 3, a part excluding the area surrounded by a broken line (the switching device 3, the probes 20a, 20b, and the stage 40) corresponds to the test circuit 10. Note that the members configuring the test circuit 10 (the coil L0, the regenerative diode D0, the switch SW0, the current interrupting device 2, and the terminals) may be provided to one substrate or to a plurality of substrates separately.

The terminal TA receives the power supply voltage Vcc from the testing apparatus 100.

The terminal TB receives a drive signal for the current interrupting device 2 from the testing apparatus 100.

The terminal TC receives a drive signal for the switching device 3 from the testing apparatus 100.

The terminal TD receives a voltage of a ground level from the testing apparatus 100.

The terminal TE is coupled to the collector electrode 3c (hereinafter also referred to simply as collector) of the switching device 3 through the stage 40.

The terminal TF is coupled to the emitter electrode 3b (hereinafter also referred to simply as emitter) of the switching device 3 through the probes 20b, and is coupled to the terminal TD of the test circuit 10.

The terminal TG is coupled to the gate electrode 3a (hereinafter also referred to simply as gate) of the switching device 3 through the probe 20a, and is coupled to the terminal TC of the test circuit 10.

The coil L0 is a load (inductive load) provided between the terminal TA and the switching device 3, and the power supply voltage Vcc is applied to the coil L0 through the terminal TA.

The regenerative diode D0 and the switch SW0 are coupled in series and provided in parallel with the coil L0.

The current interrupting device 2 is a switching device to interrupt a current supplied to the switching device 3 in the event of an abnormality, and is provided between the coil L0 and the switching device 3 (more specifically, the terminal TE). The drive signal is inputted to the gate of the current interrupting device 2 through the terminal TB. Although an IGBT is used as the current interrupting device 2 in an embodiment of the present disclosure, the present disclosure is not limited to this and, for example, a MOSFET or a switch may be used instead.

On and off of the current interrupting device 2 and the switching device 3 are controlled in response to drive signals received from the testing apparatus 100. For example, when the switching device 3 is tested, a rectangular drive signal (pulse signal) is received from the testing apparatus 100. The switching device 3 is on when the drive signal is high, and is off when the drive signal is low. Note that, for convenience, a drive signal inputted to the current interrupting device 2 is given as a pulsed signal in FIGS. 1 and 3, however, the drive signal outputted from the testing apparatus 100 to the current interrupting device 2 is usually high, and goes low only when an abnormality such as when an overcurrent is detected. In other words, the current interrupting device 2 is turned off only upon detection of an abnormality.

<Test Using Test Circuit 10>

The test circuit 10 illustrated in FIG. 3 can conduct a switching test and an avalanche test as a dynamic performance test.

A switching test monitors a change in current and a change in voltage upon application of the drive signal (pulse signal) to the gate of the switching device 3 through a gate resistor (not illustrated) by turning on (electrically connecting) the switch SW0. In this event, with the switch SW0 being on, the following free-wheeling path is formed: the coil L0→the regenerative diode D0→the coil L0. Then, for example, when a counter-electromotive voltage is generated upon turning off of the switching device 3, most of the voltage flows to the free-wheeling path, so that energy stored in the coil L0 is consumed by a resistance component of the coil L0.

In an avalanche test, the switch SW0 is turned off (not electrically connected) and the drive signal (pulse signal) is applied to the gate of the switching device 3 through a gate resistor (not illustrated). Then, electrical energy is stored in the coil L0 while the switching device 3 is on, and the energy stored in the coil L0 is applied to the switching device 3 when the switching device 3 is turned off, to thereby test robustness. Specifically, an electric field is applied between the collector and emitter of the switching device 3 to deplete the gate layer, to thereby break a defective portion due to latch up because of avalanche breakdown (an increase in current due to carries generated in the depletion layer). In this avalanche test, high energy can be applied with a low current and high voltage.

Incidentally, there are two types in common switching devices (MOSFETs and IGBTs), which are an avalanche-proof product and a non-avalanche-proof product, according to their device structure (such as substrate thickness and specific resistance).

In an avalanche-proof product, a defect can be detected by concentrating current in the defective portion by a static withstand voltage test or an avalanche test. Note that a static withstand voltage test is a test (static performance test) to check the withstand voltage by applying a voltage to the collector in a state where the gate and emitter is short circuited without using a load (such as a coil) and monitoring a current (Ic) flowing through the collector.

In contrast, a non-avalanche-proof product may break at the moment when an avalanche breakdown voltage (withstand voltage) is reached, and thus a static withstand voltage test or an avalanche test cannot be used. Thus, a switching test is used as a screening test for a non-avalanche-proof product.

In a switching test, it is a common practice to ensure safety by causing the loci of a current (Ic) flowing through the device and a voltage (Vce) applied upon turning off of a device to fall within the range of a reverse bias safe operating area (RBSOA) indicating a tolerance to breakage of the device.

Figure 4:
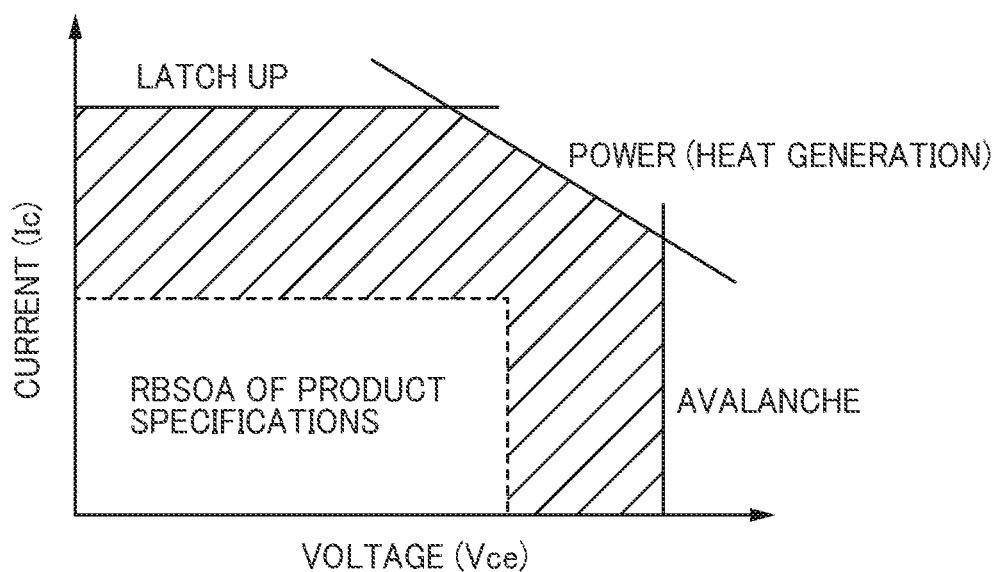
FIG. 4 is a chart illustrating a reverse bias safe operating area (RBSOA).

FIG. 4 is a chart illustrating the RBSOA. The horizontal axis represents a collector-emitter voltage (Vce), and the vertical axis represents a collector current (Ic). As illustrated in FIG. 4, when the current is large, breakage caused by latch up is noticeable, and when the voltage is large, breakage caused by avalanche is noticeable. When both of the current and the voltage are large, breakage caused by heat is noticeable.

In a case of a non-avalanche-proof product, a switching test is used to confirm that the RBSOA covers a range (e.g., the shaded part in FIG. 4) larger than the product specifications. In other words, it is needed to use a switching test under conditions equivalent to or higher than the product specifications.

Figure 5:
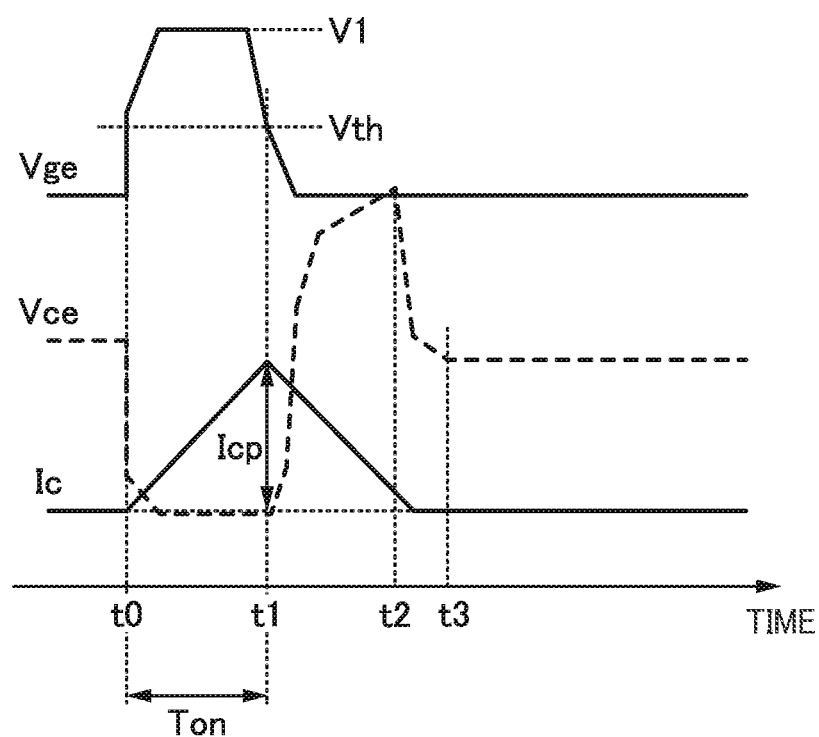
FIG. 5 is a chart illustrating a test waveform example of a comparative example.

FIG. 5 is a chart illustrating a test waveform example in a comparative example. In FIG. 5, the switching device 3 is off before time t0.

At time t0, the gate-emitter voltage (Vge) exceeds a threshold (Vth), to thereby turn on the switching device 3. In association therewith, the voltage Vce reaches substantially zero, and the collector current Ic increases. At time t1, the voltage (Vge) drops below the threshold (Vth), to thereby turn off the switching device 3. Meanwhile, the current Ic reaches its peak value Icp at time t1 and decreases thereafter. Also, the voltage Vce rises rapidly from time t1, to thereby reach its maximum at time t2. Then, at time t3, the voltage Vce returns to the same state as the state before time t0. By conducting a test with such waveforms, a current can be concentrated in a defective portion, thereby being able to detect a defect.

Note that the peak value (Icp) of the current Ic in FIG. 5 can be given by the following Formula (1):

$$Icp = Vcc \times Ton/L \quad (1)$$

where L is the inductance of the coil, and Ton is the time period during which the switching device 3 is on in response to a drive signal.

To improve the ability of defect detection by a test with such waveforms, a test using a large current is effective. However, a large current may increase damage caused by breakage.

Figure 6A:
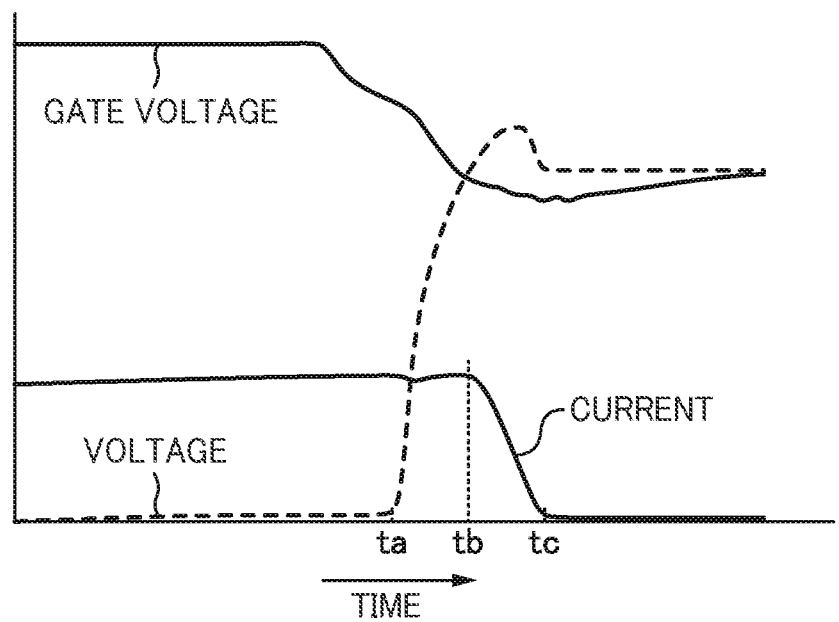
FIG. 6A is a chart illustrating an example of the current voltage (I-V) characteristics when a non-defective product is turned off.
Figure 6B:
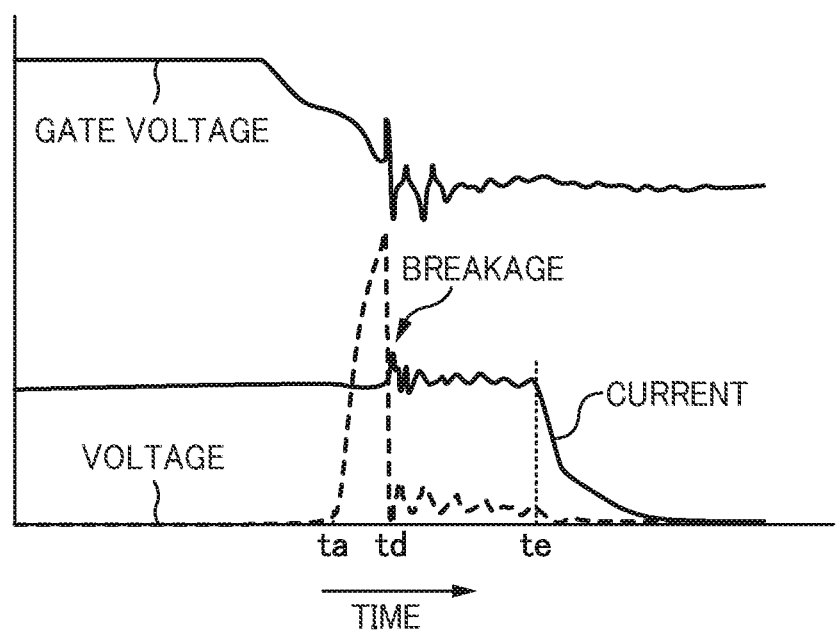
FIG. 6B is a chart illustrating an example of the I-V characteristics when a defective product is turned off.

FIG. 6A is a chart illustrating an example of current voltage (I-V) characteristics when a non-defective product is turned off, and FIG. 6B is a chart illustrating an example of I-V characteristics when a defective product is turned off. Note that in FIGS. 6A and 6B, the current is the collector current (Ic) of the switching device 3, and the voltage is the collector-emitter voltage (Vice).

In a case of a non-defective product, since the switching device 3 is turned off with a decrease in the gate voltage, the voltage (Vce) rises at time ta. Thereafter, the current starts to decrease at time tb and stops flowing at time tc. The values of the current in FIGS. 6A and 6B each are the total amount of the currents flowing through all the probes 20b contacting the emitter of the switching device 3, and currents equally flowing through the probes 20b according to the number of the probes 20b. For example, in a case where the current value at time tb is 440 A and the number of the probes 20b is twenty, a current of 22 A flows through each of the probes 20b.

Meanwhile, in a case of a defective product, the device breaks at time td (ta<td<tb) which is in the middle of the rises in the voltage (Vce) after the switching device 3 is turned off with a decrease in the gate voltage, which causes a short circuit (the voltage reaches substantially 0 V). Then, even after the voltage reaches 0V at time td, the current Ic continues to flow for a while (until time te). When a short circuit occurs as such, currents do not flow equally through the plurality of probes 20b, and a current concentratedly flows through the probe 20b near the broken portion. For instance, in a case where a current of 440 A flows before the short circuit occurs as described above, a current of 440 A flows through a single probe 20b after the short circuit occurs.

When a short circuit occurs in the switching device 3 as such, the switching device 3 may melt, due to the local concentration of the short-circuit current, and also, the tip of the probe 20 and the stage 40 may be adversely affected thereby.

Figure 7A:
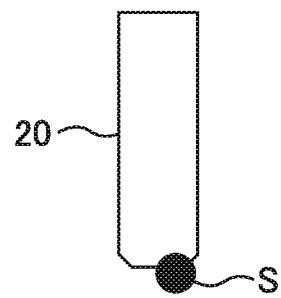
FIGS. 7A and 7B are diagrams illustrating an example when a switching device 3 melts.
Figure 7B:
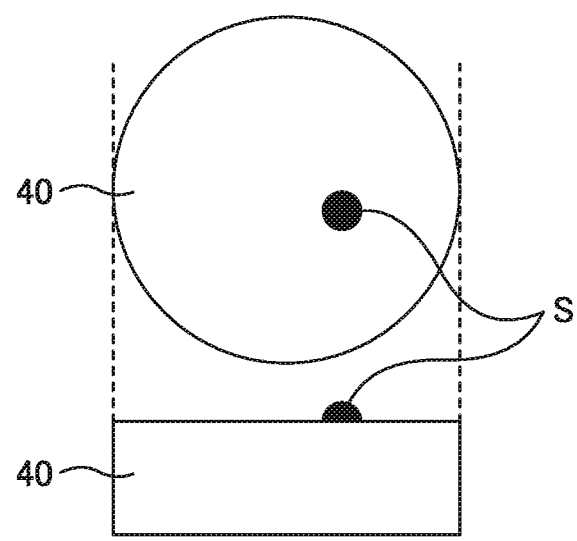

FIGS. 7A and 7B are diagrams illustrating an example when the switching device 3 melts. Note that the upper part of FIG. 7B is a top view of the stage 40, and the lower part of FIG. 7B is a side view of the stage 40.

In FIG. 7A, a melt S is attached to the tip of the probe 20 (specifically, the probe 20b). This melt S is formed of a component member of the switching device 3 (e.g., silicon) melting due to local concentration of a current. When the probe 20 with the melt S attached thereto is used to conduct a test on another switching device 3, a damage, such as a crack, may be caused in the front surface of that switching device 3. Further, other issues, such as melting (deformation) of the tip of the probe 20 itself may also be caused.

In FIG. 7B, a melt S is attached locally onto the stage 40. When the melt S is attached to the stage 40 as such, the smoothness and flatness on the stage 40 is lost by the melt S. Also, a switching device 3 to be evaluated next may be damaged by only being placed on the stage 40.

Accordingly, frequent maintenance (such as polishing, etc.) and replacement of the probes 20 and the stage 40 are needed, which raises such issues as loss caused by facility suspension (decrease in the rate of operation), labor cost for the maintenance and replacement, and cost for replacement materials. Note that the test circuit 10 includes the current interrupting device 2 to interrupt the current to the switching device 3 in the event of an abnormality, but it may take time to interrupt the current, and it is difficult to eliminate damage to the device completely.

As such, for a non-avalanche-proof product, a switching test that uses a large current is effective as a screening test. However, when there is a defective product (defect), damage caused by breakage of the device is significant, which may need replacement of the probe 20 and/or the stage 40 and lower the rate of operation, as described above. Thus, it is desirable to conduct a test where the voltage can be controlled with a low current.

Thus, embodiments of the present disclosure make it possible to provide high energy to a defective portion with a low current. This makes it possible to conduct a test equivalent to an avalanche test and perform proper evaluation while reducing the effects of breakage.

First Embodiment

Figure 8:
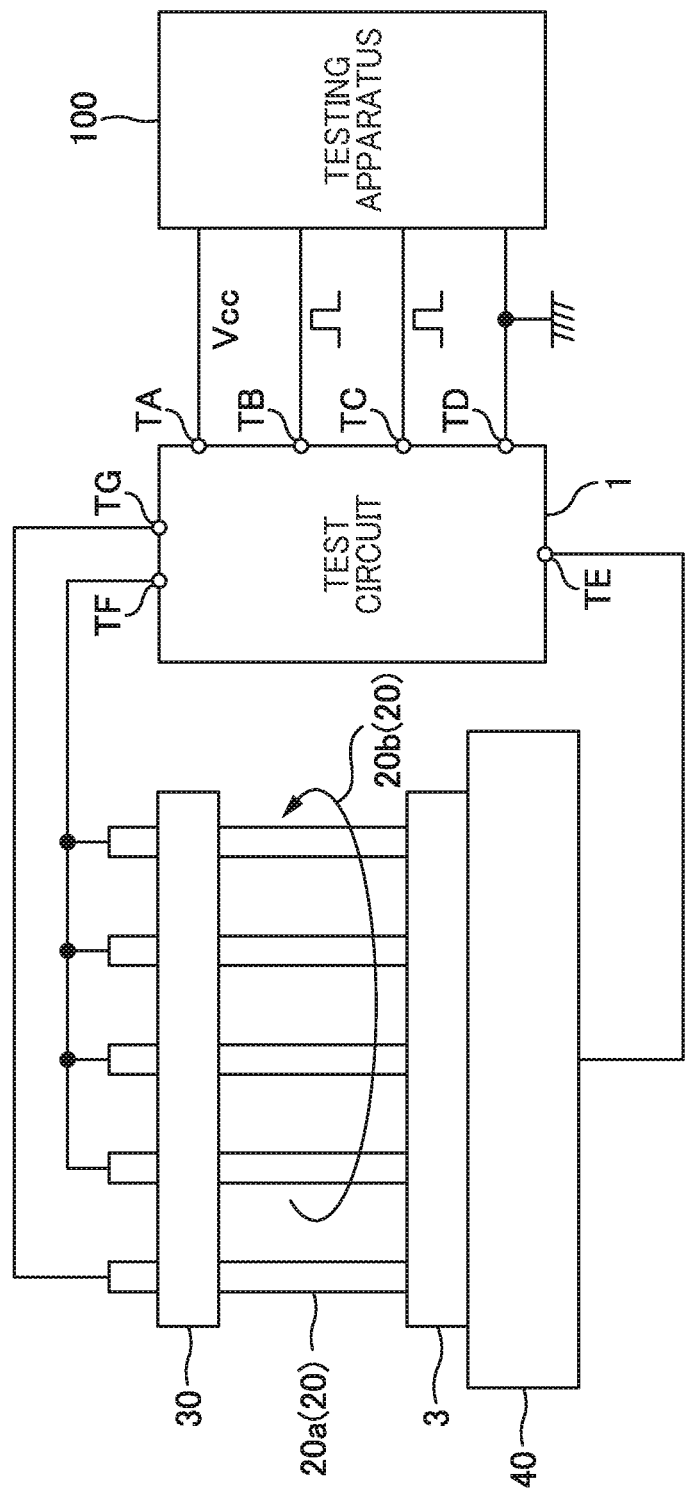
FIG. 8 is a diagram illustrating the configuration of a system including a test circuit 1 of a first embodiment.
Figure 9:
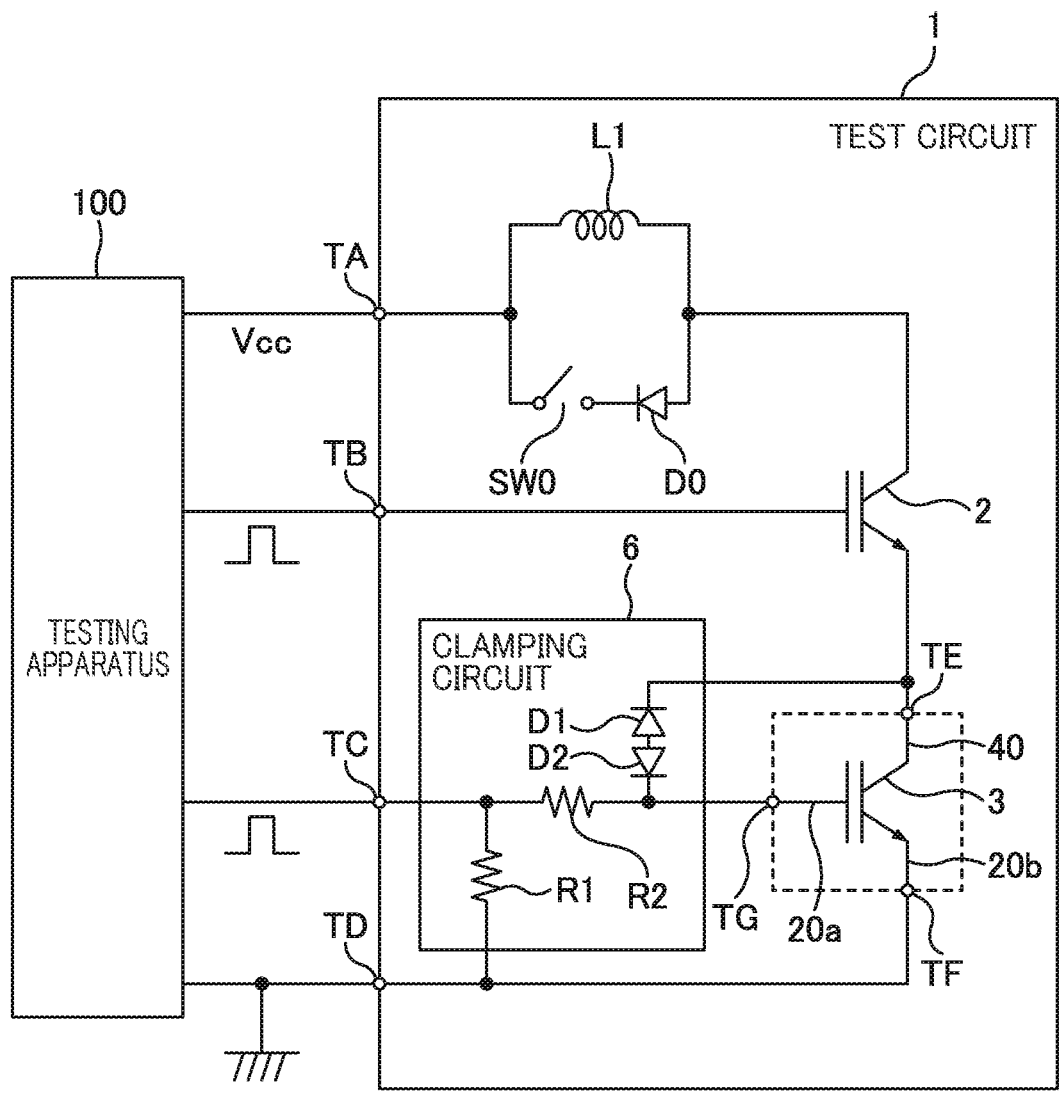
FIG. 9 is a circuit diagram illustrating a test circuit 1 of the first embodiment.

FIG. 8 is a diagram illustrating the configuration of a system including a test circuit 1 of a first embodiment. FIG. 9 is a circuit diagram illustrating the test circuit 1 of the first embodiment. Note that, in FIGS. 8 and 9, parts and components that are the same as those illustrated in in a comparative example (FIGS. 1 and 3) are given the same reference numerals and a description thereof is omitted. Also, in FIG. 9, a part excluding the area surrounded by a broken line (the switching device 3, the probes 20a, 20b, and the stage 40) corresponds to the test circuit 1. Although the switching device 3 is an IGBT in an embodiment of the present disclosure as well, the present disclosure is not limited to this, and the switching device 3 may be, for example, a MOSFET. Note that the gate of the switching device 3 corresponds to a "control electrode," the collector (drain in a case of a MOSFET) corresponds to a "power-supply electrode," and the emitter (source in the case of MOSFET) corresponds to a "ground electrode."

The test circuit 1 of the first embodiment includes terminals TA to TG, a coil L1, a regenerative diode D0, a switch SW0, a current interrupting device 2, and a clamping circuit 6. In the first embodiment as well, the members configuring the test circuit 1 may be provided in a single substrate or in a plurality of substrates separately.

The terminals TA to TG are the same terminals as those in a comparative example. Note that the terminal TC corresponds to a "first terminal" to receive a drive signal (pulse signal) for the switching device 3, and the terminal TF (and the terminal TD) corresponds to a "second terminal" coupled to the emitter of the switching device 3. In addition, the terminal TG corresponds to a "third terminal" coupled to the gate of the switching device 3, and the terminal TE corresponds to a "fourth terminal" coupled to the collector of the switching device 3. In addition, the terminal TA corresponds to a "fifth terminal" to receive the power supply voltage Vcc.

The coil L1 is, similarly to the coil L0 of a comparative example, a load (inductive load) provided between the terminal TA and the switching device 3. However, the coil L1 is different from the coil L0 in the value of the inductance. Specifically, the inductance value is determined based on the foregoing Formula (1) such that the peak value Icp of the current Ic may be smaller than that of the coil L0.

The clamping circuit 6 performs protection such that the collector-emitter voltage (Vce) will not exceed a predetermined voltage (withstand voltage) when the switching device 3 is turned off in response to a drive signal. Also, in an operation of clamping, the clamping circuit 6 keeps the switching device 3 on irrespective of the drive signal received from the testing apparatus 100. The clamping circuit 6 is provided, between the terminal TF and the terminal TE, in parallel with the switching device 3. The clamping circuit 6 is also coupled to the terminal TC and the terminal TG. As illustrated in FIG. 9, the clamping circuit 6 includes diodes D1, D2 and resistors R1, R2.

The diode D1 is a diode for generating a clamping voltage for the clamping circuit 6 and is provided between the terminal TE and the terminal TG. The cathode of the diode D1 is coupled to the terminal TE. Note that a diode having a withstand voltage (voltage V2 to be described later) lower than a withstand voltage of the switching device 3 is selected and used as the diode D1. Note that although there is only one single diode D1 in FIG. 9, there may be two or more diodes D1 to have a desired withstand voltage (i.e., two or more diodes D1 may be provided between the terminal TE and the diode D2).

The diode D2 is a diode for reverse current protection. The diode D2 has an anode coupled to the anode of the diode D1 and a cathode coupled to the terminal TG. Note that the diode D1 corresponds to a "first diode," and the diode D2 corresponds to a "second diode."

The resistor R1 and the resistor R2 are to generate a voltage at the terminal TG (in other words, the gate of the switching device 3), and is coupled in series between the terminal TG and the terminal TF (and the terminal TD). Also, the coupling point at which the resistor R1 and the resistor R2 are coupled to each other is coupled to the terminal TC. Note that the resistor R1 corresponds to a "first resistor," and the resistor R2 corresponds to a "second resistor."

Next, a description will be given of a screening test using the test circuit 1.

Here, a test similar to that of a comparative example is conducted with the switch SW0 being off as illustrated the figure.

Figure 10:
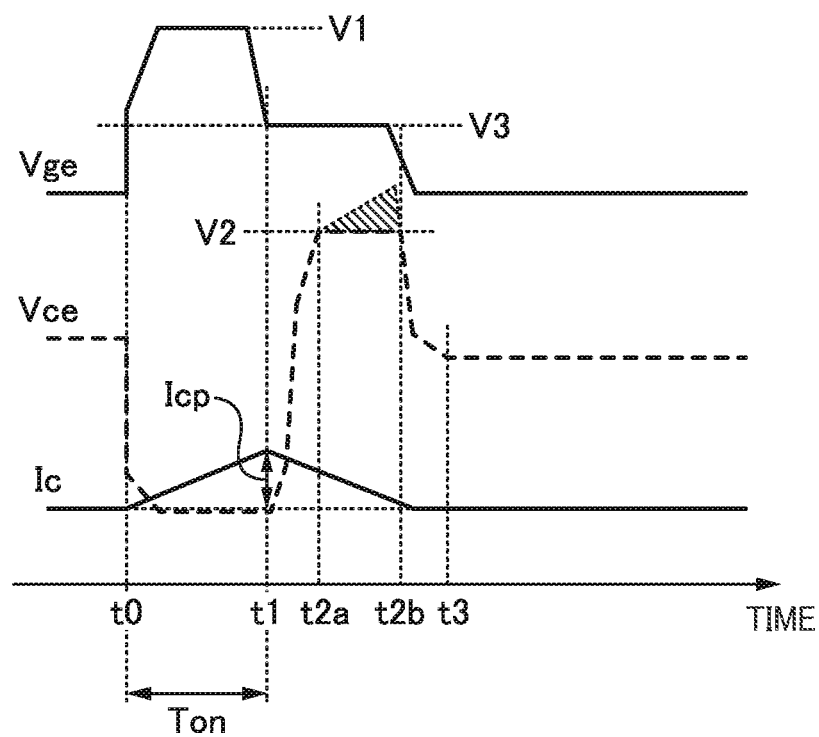
FIG. 10 is a chart illustrating a test waveform example of the first embodiment.

FIG. 10 is a chart illustrating a test waveform example of the first embodiment. In FIG. 10, Vge is a gate-emitter voltage of the switching device 3, Vce is a collector-emitter voltage of the switching device 3, and Ic is a collector current of the switching device 3.

From time t0 to time t1, the voltage Vge and the voltage Vce have the same waveforms as those in FIG. 5 (comparative example). The switching device 3 is turned on in response to the drive signal at time t0, and thus the voltage Vge is at a voltage V1 higher than the threshold Vth. In other words, the clamping circuit 6 causes the voltage at the terminal TG to be the voltage V1 higher than the threshold Vth, when the switching device 3 is turned on in response to the drive signal received at the terminal TC. Also, although the switching device 3 is turned off in response to the drive signal at time t1, the switching device 3 remains on because a voltage V3 equal to or higher than the threshold Vth is applied to the gate of the switching device 3 by virtue of the operation of the clamping circuit 6, as will be described later.

In the test circuit 1 of an embodiment of the present disclosure, the withstand voltage of the diode D1 of the clamping circuit 6 (here, the voltage V2 at time t2a) is lower than the withstand voltage of the switching device 3. Thus, when the voltage Vce rises at time t1, the diode D1 breaks down at the voltage V2 first to protect the switching device 3. Also, by the breakdown of the diode D1, a current flows through the resistors R1 and R2 through the diode D2. As a result, the voltage V3 equal to or higher than the threshold Vth is generated at the terminal TG. Since this voltage V3 is applied to the gate of the switching device 3, the switching device 3 is on during a time period from time t2a to time t2b regardless of the drive signal. Just before time t2b, the voltage Vge drops below the voltage V3, and the switching device 3 is turned off. At time t2b, the voltage Vce drops below the voltage V2, and the clamping operation of the clamping circuit 6 ends. Then, at time t3, the value of the voltage Vce returns to the original value (the value when the switching device 3 is off). Note that, in an embodiment of the present disclosure, the voltage V1 corresponds to a "first voltage," the voltage V2 corresponds to a "second voltage," and the voltage V3 corresponds to a "third voltage."

As illustrated in FIG. 10, in an embodiment of the present disclosure, with the setting of the inductance of the coil L1, the peak value (Icp) of the current Ic at time t1 is smaller than that in a comparative example. This peak value Icp is desirably set to a value such that the switching device 3 does not melt when the switching device 3 is energized upon contact with a single probe 20. This prevents the melt S from attaching to the probe 20 and the stage 40 as illustrated in FIGS. 7A and 7B, even if the switching device 3 has a defect and such a defective portion breaks due to current concentration.

In the test circuit 1 of an embodiment of the present disclosure, the peak value Icp of the current Ic is made smaller by the coil L1, and the voltage (clamping voltage) at the terminal TE can be controlled by the clamping circuit 6, thereby being able to reduce effects of breakage of the switching device 3. This can reduce the frequency of the replacement and maintenance of the stage 40 and the probe 20, which makes it possible to improve the rate of operation.

As such, the switching device 3 is turned on to pass a current (low current) while the clamping circuit 6 performs clamping at the voltage V2 lower than the withstand voltage of the switching device 3, to thereby consume the energy stored in the coil L1. In the test circuit 1 of an embodiment of the present disclosure, this can provide a moderate stress to the switching device 3, and a test with a low-current and high-voltage equivalent to those in an avalanche test can be conducted on a switching device 3 which is a non-avalanche-proof product. Thus, the switching device 3 can be properly evaluated.

Second Embodiment

The withstand voltages of switching devices are not always the same, but vary from one device (chip) to another due to, for example, manufacturing variation. When the clamping voltage is constant, the relationship between the clamping voltage and the withstand voltage of the switching device may reverse, and if it reverses, the switching device breaks down first, and thus proper evaluation cannot be performed. Accordingly, in a second embodiment, the clamping voltage is changeable.

Figure 11:
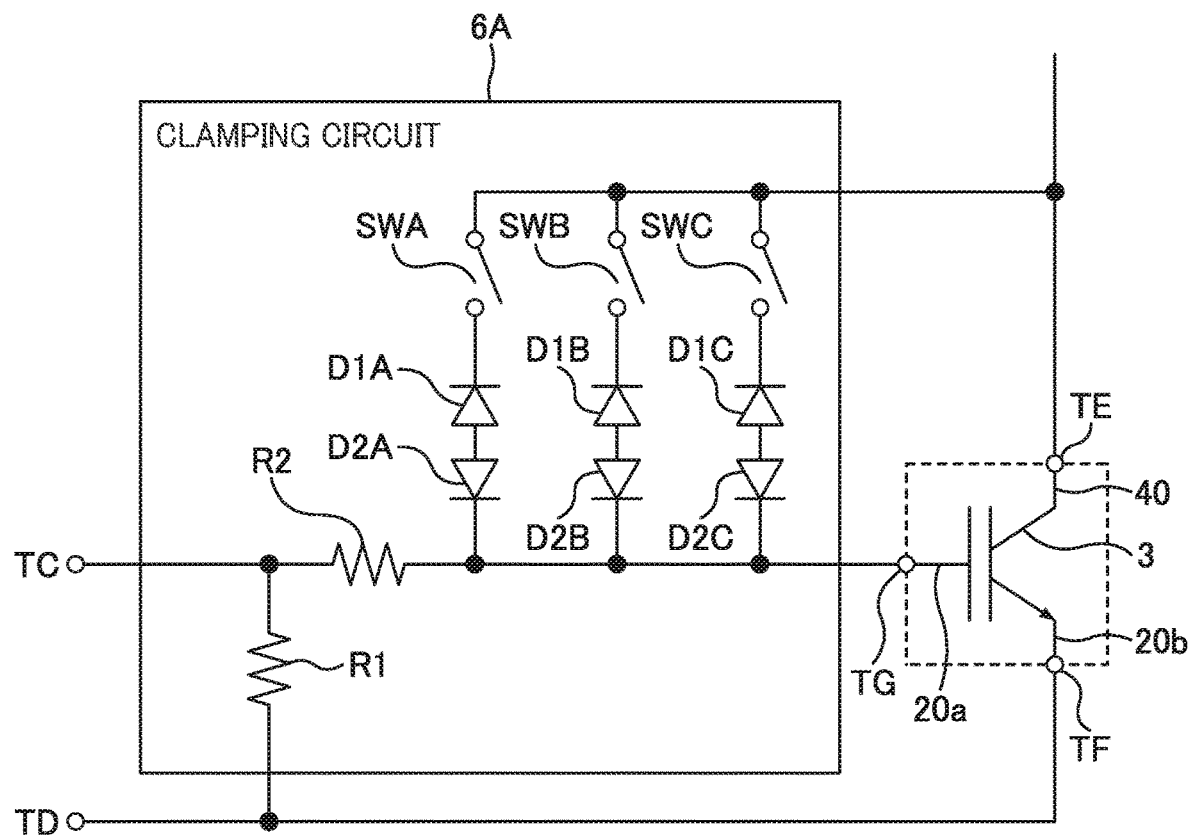
FIG. 11 is a circuit diagram of a clamping circuit 6A of a second embodiment.

FIG. 11 is a circuit diagram of a clamping circuit 6A of the second embodiment. Note that parts and components other than the clamping circuit 6A are the same as those of the first embodiment, and thus illustration and description are omitted.

The clamping circuit 6A of the second embodiment includes switches SWA to SWC, diodes D1A to D1C, diodes D2A to D2C, and resistors R1 and R2.

The switch SWA, the diode D1A, and the diode D2A are coupled in series, the switch SWB, the diode D1B, and the diode D2B are coupled in series, and the switch SWC, the diode D1C, and the diode D2C are coupled in series. Also, these serially-coupled combinations are disposed in parallel between the terminal TE and the terminal TG.

The diodes D1A to D1C are diodes to set a clamping voltage and have different withstand voltages from one another. In an embodiment of the present disclosure, the withstand voltages of the diodes D1A to D1C have the following relation: D1A<D1B<D1C. Note that one of the diodes D1A to D1C corresponds to the "first diode," and another one thereof corresponds to the "third diode."

The diodes D2A to D2C are diodes for reverse current protection, similarly to the diode D2 in the first embodiment.

The switches SWA to SWC switch between electrical continuity and discontinuity between the terminal TE and the diodes D1A to D1C. For example, when the switch SWA is on and the switches SWB, SWC are off, the diode D1A is coupled to the terminal TE (in other words, a combination of the diode D1A and the diode D2A is coupled between the terminal TE and the terminal TG). Note that the switches SWA to SWC correspond to the "coupling circuit."

Next, a description will be given of a test using the clamping circuit 6A of the second embodiment.

Figure 12:
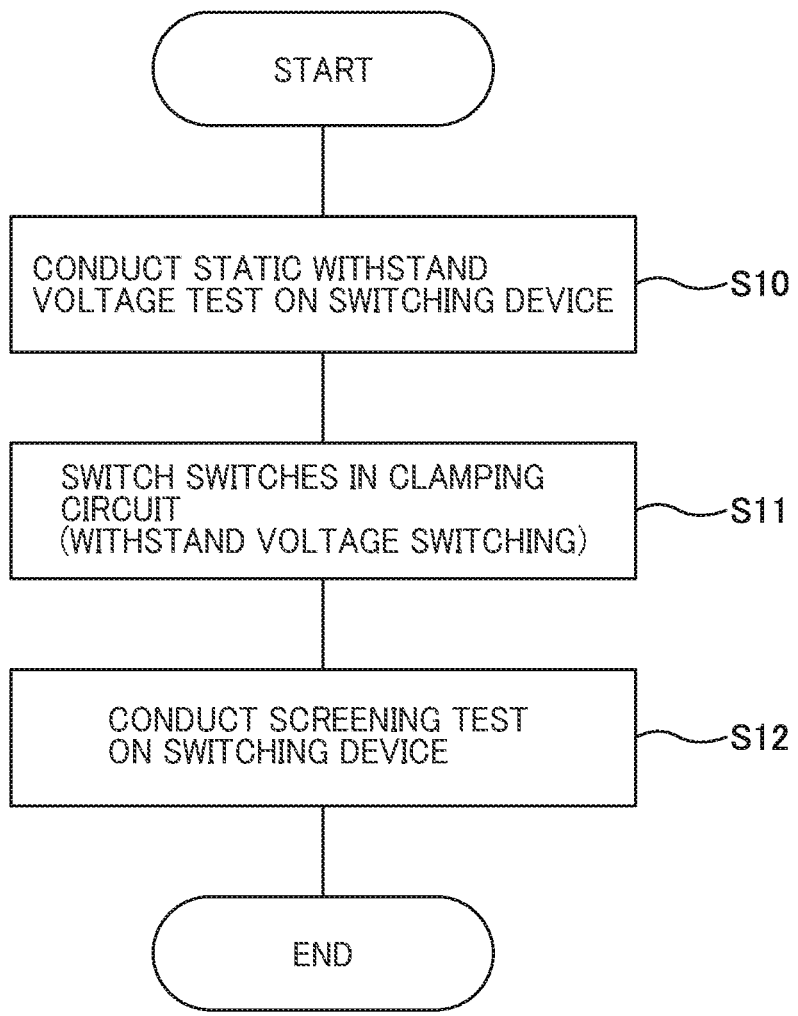
FIG. 12 is a flowchart illustrating a testing method of the second embodiment.

FIG. 12 is a flowchart illustrating a testing method of the second embodiment.

First, a static withstand voltage test is performed to evaluate a withstand voltage by applying a voltage to the collector of the switching device 3 (Step S10: first test step).

Figure 13:
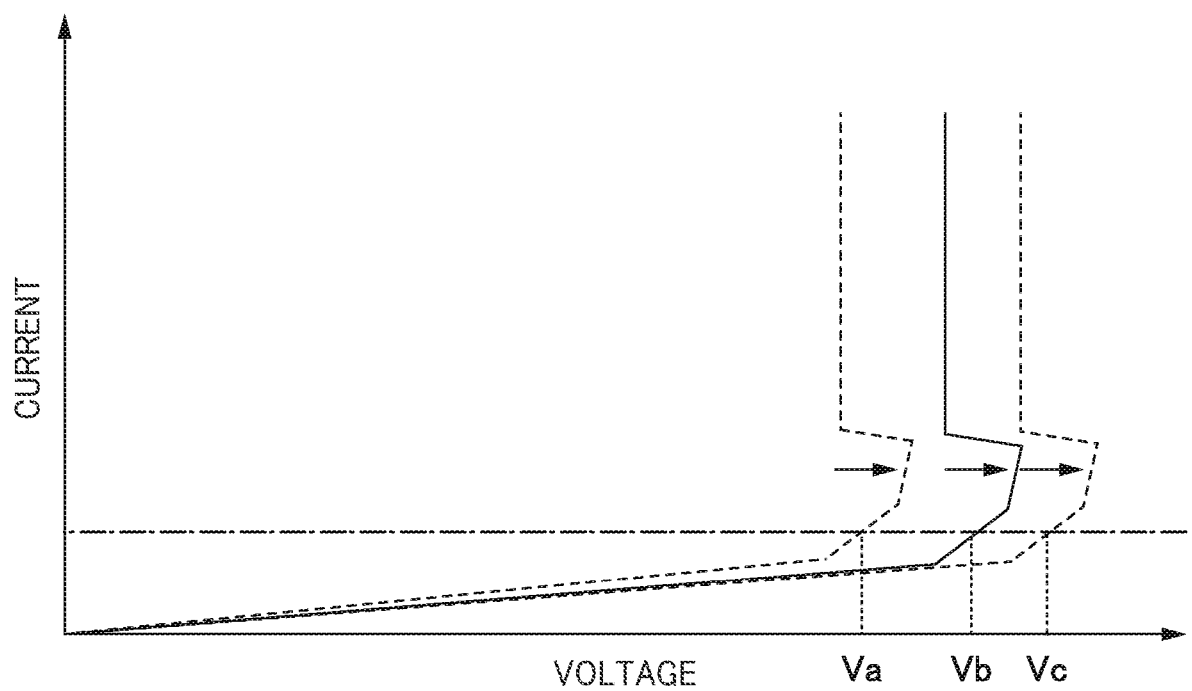
FIG. 13 is a chart illustrating an example of a result of a static withstand voltage test.

FIG. 13 is an example of a test result of the static withstand voltage test. In FIG. 13, the horizontal axis represents the voltage applied to the collector (collector-emitter voltage (Vice)), and the vertical axis represents a current flowing through the collector.

In the static withstand voltage test, as illustrated in FIG. 13, when the voltage Vce is raised, the voltage Vce reaches its peak (static withstand voltage) at a certain point (e.g., near the arrows in FIG. 13) and then drops. Normally, the voltage rises again, but if the device is broken, the current Ic increases while the voltage Vce does not rise, as illustrated. As described earlier, a non-avalanche-proof product may break at the moment at which the withstand voltage is reached, and thus the voltage is raised to obtain a voltage at which the relationship between the voltage and the current changes (the slope changes) with the current (Ic) being in a low range (e.g., a range of several milliamperes or lower). In an embodiment of the present disclosure, voltages at which the current Ic is the value indicated by the dashed-dotted line are detected.

FIG. 13 illustrates results of tests performed on a plurality of (three here) switching devices 3. As illustrated in FIG. 13, due to manufacturing variation and the like, the withstand voltages (static withstand voltages) are different, and so are the voltages at the dashed-dotted line (Va<Vb<Vc).

Next, based on the test results of the static withstand voltage tests, switching is performed among the switches SWA to SWC of the clamping circuit 6A (Step S11: selection step). In other words, one to be coupled to the terminal TE is selected from the diodes D1A to D1C. The clamping voltage (withstand voltage) at the terminal TE is thereby switched.

Figure 14:
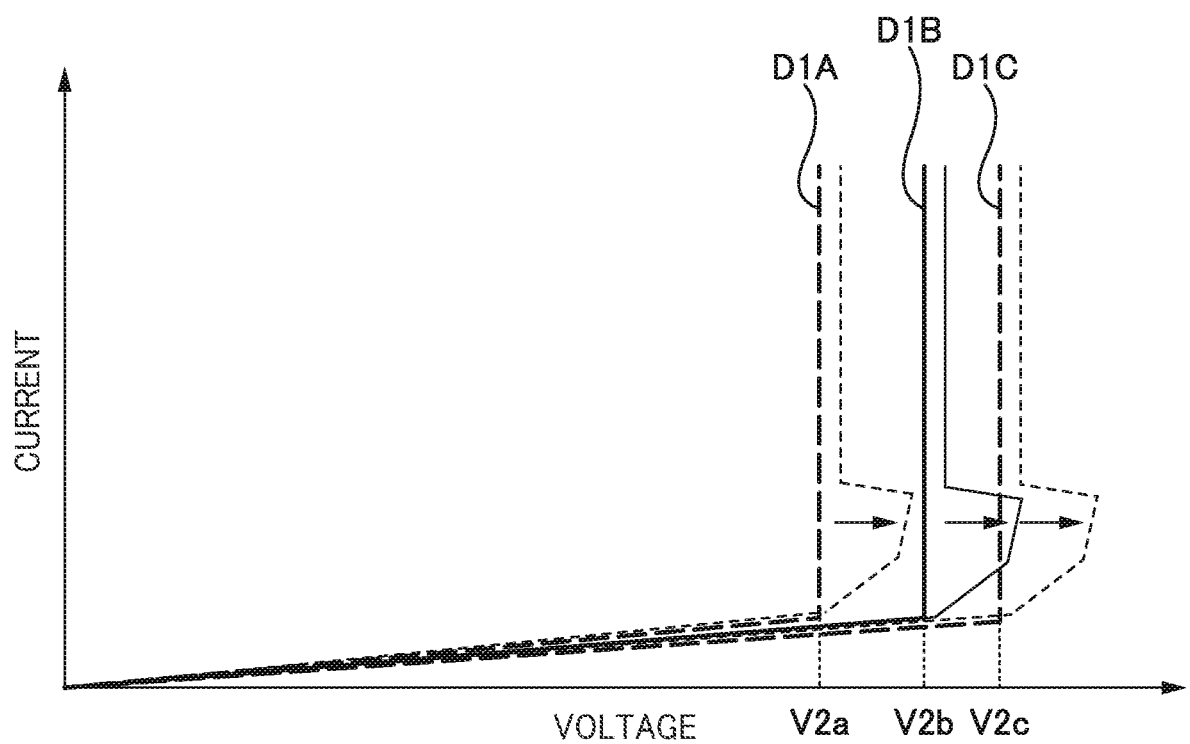
FIG. 14 is a chart illustrating a relationship between the withstand voltages of switching devices 3 and the withstand voltages of diodes D1A to D1C.

FIG. 14 is a diagram illustrating the relationship between the withstand voltages of the switching devices 3 and the withstand voltages of the diodes D1A to D1C, where, V2a, V2b, and V2c are the withstand voltages of the diode D1A, the diode D1B, and the diode D1C, respectively (V2a<V2b<V2c). Further, V2a is lower than Va, V2b is lower than Vb, and V2c is lower than Vc.

For example, when the withstand voltage of the switching device 3 to be tested is Vb, on and off of the switches SWA to SWC are switched so as to select a diode with a withstand voltage lower than Vb (in this case, the diode D1B). Specifically, the switch SWB is turned on, and the switches SWA and SWC are turned off.

Then, a screening test of the switching device 3 is conducted similarly to the first embodiment (S12: second test step).

As such, it is possible to change the clamping voltage by providing the diodes D1A to D1C and switching one to be coupled to the terminal TE thereamong. Although three diodes (diodes D1A to D1C) are provided in parallel in an embodiment of the present disclosure, the number thereof is not limited to three as long as it is two or more. However, the greater the number of diodes, the greater the number of setting of the withstand voltage (clamping voltage).

<<Modification>>

Figure 15:
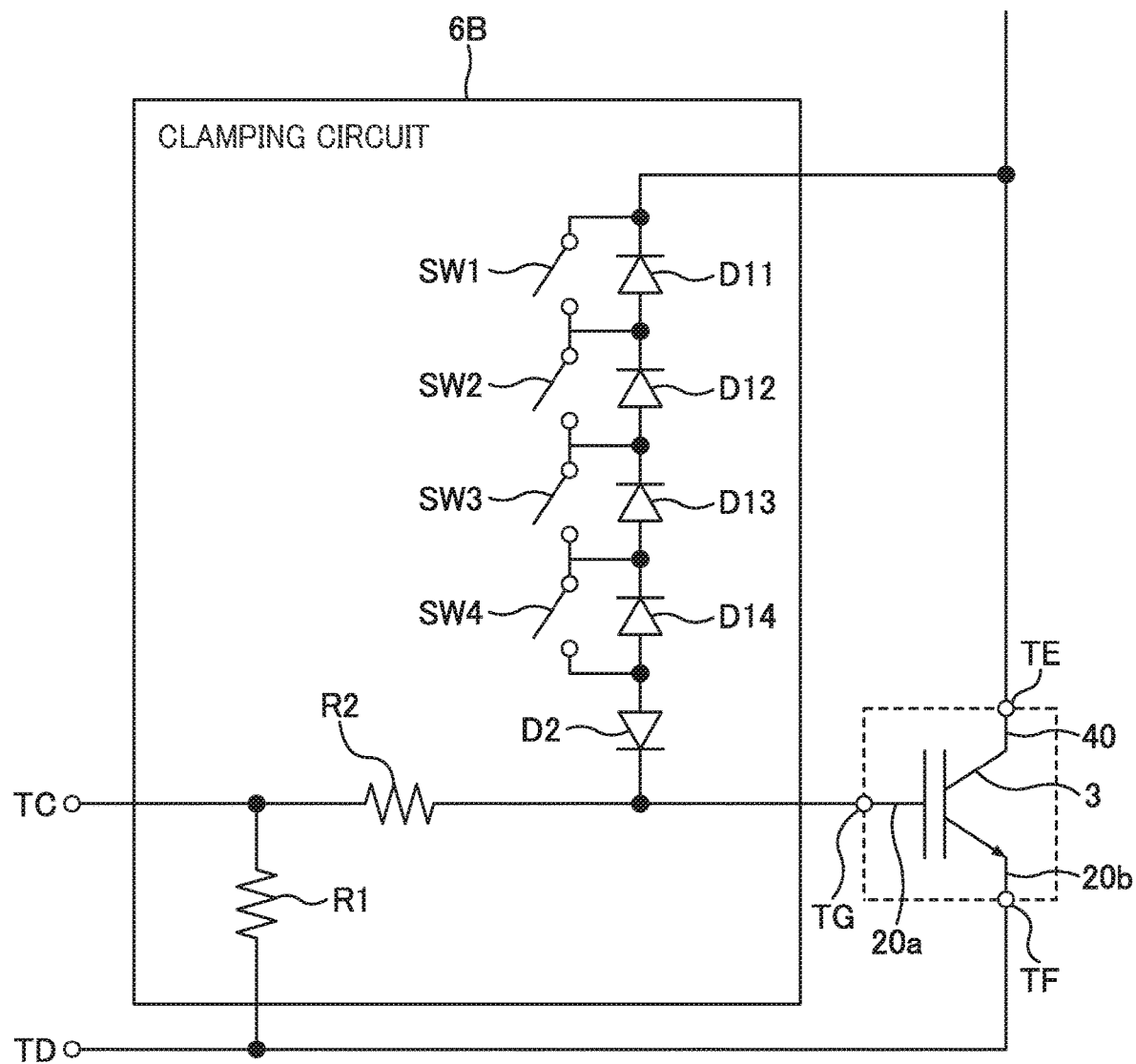
FIG. 15 is a circuit diagram illustrating a clamping circuit 6B of a modification of the second embodiment.

FIG. 15 is a circuit diagram illustrating a clamping circuit 6B of a modification of the second embodiment. Note that, in this modification as well, parts and components other than the clamping circuit 6B are the same as those of the first embodiment (FIG. 9), and thus illustration and description are omitted. Further, parts and components that are the same as those in the first embodiment (FIG. 9) are given the same reference numerals and a description thereof is omitted.

The clamping circuit 6B of the modification includes diodes D11 to D14 and switches SW1 to SW4. The diodes D11 to D14 are coupled in series between the terminal TE and the diode D2 for reverse current protection. The diodes D11 to D14 may have withstand voltages different from one another or the same withstand voltage. Four diodes (diodes D11 to D14) are coupled in series in the present modification, however, it is not limited thereto as long as it is two or more. Note that any one of the diodes D11 to D14 (e.g., diode D11) corresponds to the "first diode," and a diode coupled in series thereto (e.g., diode D12) corresponds to a "fourth diode."

The switches SW1 to SW4 are provided in parallel with the diodes D11 to D14, respectively. Then, the clamping voltage at the terminal TE (collector of switching device 3) can be set according to the on-off switching of the switches SW1 to SW4. Switches (switches SW1 to SW4) are respectively provided in parallel with the diodes D11 to D14 in an embodiment of the present disclosure, however, it is not limited thereto as long as at least one switch is provided. This makes it possible to change a clamping voltage by switching of the switch(es).

As in this modification, a configuration may be such that a plurality of diodes are coupled in series and switches coupled in parallel therewith are turned on and off, to thereby change the clamping voltage at the terminal TE.

As another method of changing the clamping voltage at the terminal TE, the diode D1 of the clamping circuit 6 in the first embodiment may be replaceable with a diode with a different withstand voltage.

=====Summary=====

A description has been given of the test circuit 1 which is one embodiment of the present disclosure. The test circuit 1 is a test circuit to be used in conducting a screening test on a switching device 3, and the test circuit 1 has the terminal TC to receive a drive signal to turn on and off the switching device 3, the terminal TF coupled to the emitter of the switching device 3, the terminal TG coupled to the gate of the switching device 3, the terminal TE coupled to the collector of the switching device 3, and the clamping circuit 6 coupled between the terminal TE and the terminal TF.

The clamping circuit 6 is configured to, upon turning on of the switching device 3 responsive to the drive signal, cause a voltage at the terminal TG to be the voltage V1 higher than the threshold Vth of the switching device 3, and the clamping circuit 6 is configured to, upon turning off of the switching device 3 responsive to the drive signal, cause the voltage at the terminal TG to be the voltage V3 between the threshold Vth of the switching device 3 and the voltage V1, while clamping a voltage at the terminal TE to the voltage V2 lower than the withstand voltage of the switching device 3.

This makes it possible to conduct a test with a low current and high voltage equivalent to those in an avalanche test, on an object to be tested (switching device 3) which is a non-avalanche-proof product, thereby being able to properly evaluate the switching device 3.

In addition, the clamping circuit 6 includes the diode D1 between the terminal TE and the terminal TG, to clamp the voltage at the terminal TE to the voltage V2, and the resistor R1 provided between the diode D1 and the terminal TF. This makes it possible to apply the voltage V3 to the terminal TG to thereby turn on the switching device 3 while the voltage at the terminal TE is being clamped to the voltage V2.

In addition, the clamping circuit 6 includes the diode D2 having an anode coupled to the anode of the diode D1 and a cathode coupled to the terminal TG. This makes it possible to prevent reverse current when the switching device 3 is turned on in response to the drive signal.

In addition, the clamping circuit 6 includes the resistor R2 coupled between the cathode of the diode D2 and the resistor R1. This makes it possible to facilitate control of the voltage applied to the gate of the switching device 3.

In addition, the clamping circuit 6A of the second embodiment includes: a diode (diode D1B, D1C) coupled in parallel with the diode D1A, the diode having a withstand voltage different from that of the diode D1A; and the coupling circuit (switches SWA to SWC) configured to couple the diode D1A, D1B, or D1C to the terminal TE. This makes it possible to change the clamping voltage, thereby enabling more accurate evaluation.

In addition, the clamping circuit 6B of a modification of the second embodiment includes: the diode D12 coupled in series with the diode D11; and the switch SW1 coupled in parallel with the diode D11. This makes it possible to change the clamping voltage, thereby enabling more accurate evaluation.

In addition, the test circuit 1 includes: the terminal TA to receive the power supply voltage Vcc; and the coil L1 provided between the terminal TA and the collector of the switching device 3. This makes it possible to apply energy stored in the coil L1 to the switching device 3 during a test. Further, with the setting of the inductance of the coil L1, it is possible to decrease the value of the peak value Icp so that the switching device 3 will not melt when it breaks.

In addition, the testing method of the second embodiment includes: Step S10 of conducting a static withstand voltage test to evaluate a withstand voltage of the switching device 3; Step S11 of selecting one of the diode D1A to D1C, based on a result of the static withstand voltage test, such that the voltage at the terminal TE will be lower than the withstand voltage of the switching device; and Step S12 of conducting a screening test using the diode that has been selected. This makes it possible to change the clamping voltage, thereby enabling more accurate evaluation.

The present disclosure is directed to provision of a test circuit capable of proper evaluation of a switching device.

The present disclosure can provide a test circuit capable of proper evaluation of a switching device.

Embodiments and modifications of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A test circuit for conducting a test on a switching device, the switching device having a ground electrode, a control electrode, and a power-supply electrode, the test circuit comprising:
   a first terminal configured to receive a drive signal to turn on and off the switching device;
   a second terminal coupled to the ground electrode of the switching device;
   a third terminal coupled to the control electrode of the switching device;
   a fourth terminal coupled to the power-supply electrode of the switching device; and
   a clamping circuit coupled between the second terminal and the fourth terminal,
   the clamping circuit being configured to, upon turning on of the switching device responsive to the drive signal, cause a voltage at the third terminal to be a first voltage higher than a threshold of the switching device, and
   the clamping circuit being configured to, upon turning off of the switching device responsive to the drive signal, and while clamping a voltage at the fourth terminal to a second voltage lower than a withstand voltage of the switching device, cause the voltage at the third terminal to be a third voltage that is between the threshold of the switching device and the first voltage.

2. The test circuit according to claim 1, wherein the clamping circuit includes
   a first diode provided between the fourth terminal and the third terminal, to clamp the voltage at the fourth terminal to the second voltage, and
   a first resistor provided between the first diode and the second terminal.

3. The test circuit according to claim 2, wherein the clamping circuit further includes a second diode having
   an anode coupled to an anode of the first diode, and
   a cathode coupled to the third terminal.

4. The test circuit according to claim 3, wherein the clamping circuit further includes a second resistor coupled between the cathode of the second diode and the first resistor.

5. The test circuit according to claim 2, wherein the clamping circuit includes
   a third diode coupled in parallel with the first diode, the third diode having a withstand voltage different from a withstand voltage of the first diode, and
   a coupling circuit configured to couple the first diode or the third diode to the fourth terminal.

6. The test circuit according to claim 2, wherein the clamping circuit includes
   a fourth diode coupled in series with the first diode, and
   at least a switch coupled in parallel with the first diode.

7. The test circuit according to claim 1, comprising:
   a fifth terminal configured to receive a power supply voltage; and
   a coil provided between the fifth terminal and the power-supply electrode of the switching device.

8. A testing method of conducting a test on a switching device, the switching device having a ground electrode, a control electrode, and a power-supply electrode, the testing method comprising:
   preparing a test circuit including
      a first terminal configured to receive a drive signal to turn on and off the switching device,
      a second terminal coupled to the ground electrode of the switching device,
      a third terminal coupled to the control electrode of the switching device,
      a fourth terminal coupled to the power-supply electrode of the switching device, and
      a clamping circuit coupled between the second terminal and the fourth terminal, the clamping circuit including
         a first diode configured to clamp a voltage at the fourth terminal, and
         a first resistor provided between the first diode and the second terminal;
   a first test step of conducting a static withstand voltage test to evaluate a withstand voltage of the switching device;
   a selection step of selecting the first diode, based on a result of the static withstand voltage test, such that the voltage at the fourth terminal is lower than the withstand voltage of the switching device; and
   a second test step of conducting the test using the first diode that has been selected.

* * * * *